United States Patent
Irisawa et al.

(10) Patent No.: US 8,174,095 B2
(45) Date of Patent: May 8, 2012

(54) SEMICONDUCTOR DEVICE AND MANUFACTURING METHOD THEREOF

(75) Inventors: Toshifumi Irisawa, Tokyo (JP); Shinichi Takagi, Tsukuba (JP); Naoharu Sugiyama, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/037,049

(22) Filed: Feb. 28, 2011

(65) Prior Publication Data

US 2011/0147805 A1 Jun. 23, 2011

Related U.S. Application Data

(62) Division of application No. 11/950,716, filed on Dec. 5, 2007, now Pat. No. 8,008,751.

(30) Foreign Application Priority Data

Dec. 8, 2006 (JP) ................. 2006-332020

(51) Int. Cl.
H01L 29/04 (2006.01)
(52) U.S. Cl. .............. 257/627; 257/628; 257/347
(58) Field of Classification Search .......... 257/627–628, 257/347
See application file for complete search history.

(56) References Cited

U.S. PATENT DOCUMENTS

2006/0214226 A1 9/2006 Chen et al.

FOREIGN PATENT DOCUMENTS

| JP | 2001-160594 | 6/2001 |
|----|-------------|--------|
| JP | 2005-039171 | 2/2005 |

OTHER PUBLICATIONS

Irisawa, et al., "High Current Drive Uniaxially-Strained SGOI pMOSFETs Fabricated by Lateral Strain Relaxation Technique", pp. 178-179, 2005 Symposium on VLSI Technology Digest of Technical Papers.

Lei, et al., "Strain relaxation in patterned strained silicon directly on insulator structures"; 2005 American Institute of Physics, pp. 251926-1251926-3.

Irie, et al., "In-plane mobility anisotropy and universality under uni-axial strains in n- and p-MOS inversion layers on (100), (110), and (111) Si", IEDM, Jan. 2004, pp. 9.5.1-9.5.4.

Chan, et al., Fabrication and mobility characteristics of ultra-thin strained Si directly on Insulator (SSDOI) MOSFETs, IEDM, May 2003, pp. 3.1.1-3.1.4.

U.S. Appl. No. 11/725,469, filed Mar. 20, 2007.
U.S. Appl. No. 11/705,450, filed Feb. 13, 2007.

(Continued)

*Primary Examiner* — Samuel Gebremariam
(74) *Attorney, Agent, or Firm* — Ohlandt, Greeley, Ruggiero & Perle, L.L.P.

(57) ABSTRACT

A semiconductor device includes an insulator layer, and an n-channel MIS transistor having an n channel and a pMIS transistor having a p channel which are formed on the insulator layer, wherein the n channel of the n-channel MIS transistor is formed of an Si layer having a uniaxial tensile strain in a channel length direction, the p channel of the p-channel MIS transistor is formed of an SiGe or Ge layer having a uniaxial compressive strain in the channel length direction, and the channel length direction of each of the n-channel MIS transistor and the p-channel MIS transistor is a <110> direction.

18 Claims, 4 Drawing Sheets

OTHER PUBLICATIONS

U.S. Appl. No. 11/437,730, filed May 22, 2006.
U.S. Appl. No. 11/369,662, filed Feb. 21, 2003.
U.S. Appl. No. 10/188,824, filed Jul. 5, 2002.
Tezuka, et al., "*A novel fabrication technique of ultrathin and relaxed SeGe buffer layers with High Ge fraction for Sub-100 nm Strained silicon-on-insulator MOSFETs*", 2000, pp. 2866-2874.
Choi, et al, "*Sub-20nm CMOS FinFET Technologies*", IEEE, Mar. 2001, pp. 19.1.119.1.4.
Irisawa, et al., "*Electron Transport Properties of Ultrathin-body and Tri-gate SOI nMOSFETs with Biaxial and Uniaxial Strain*", IEEE, 2006, 4 pps.
Irisawa, et al., "*High performance multi-gate pMOSFETs using uniaxially-strained SGOI channels*", IEEE, 2005, 4 pps.
Uchida, et al., "*Physical Mechanisms of electron mobility enhancement in uniaxial stressed MOSFETs and impact of uniaxial stress engineering in ballistic regime*", IEEE, Aug. 2005, 4 pps.

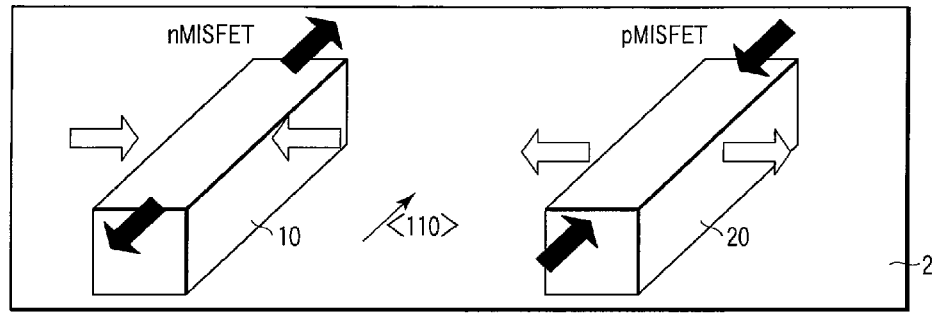
F I G. 5
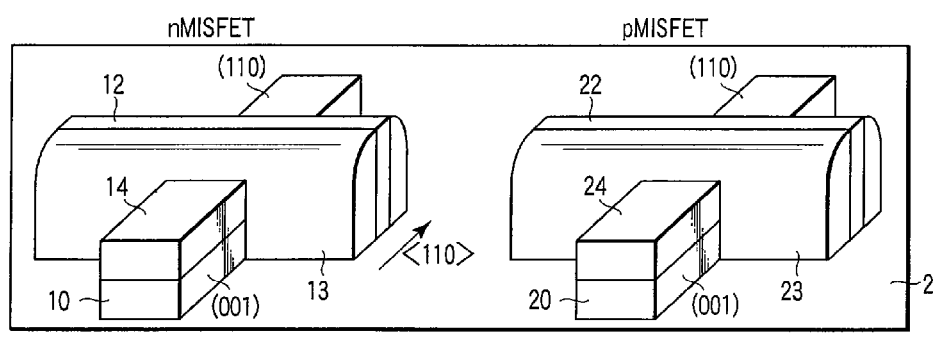
F I G. 6
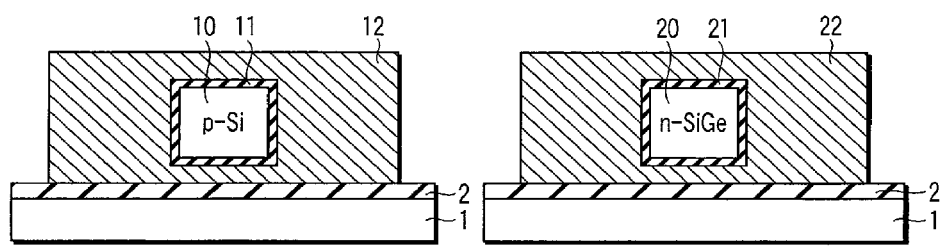
F I G. 7A          F I G. 7B

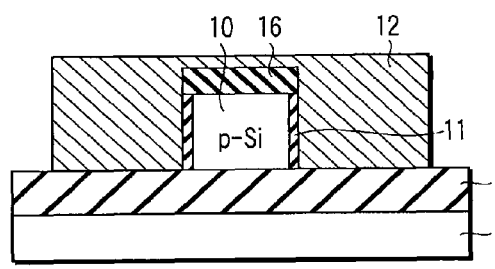
F I G. 8A
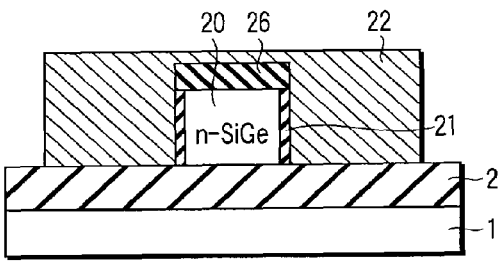
F I G. 8B
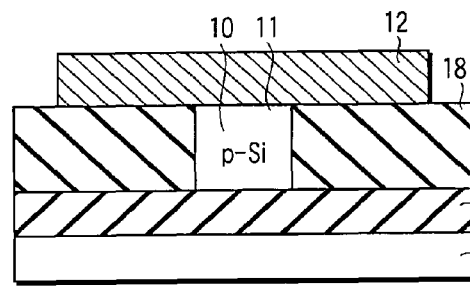
F I G. 9A
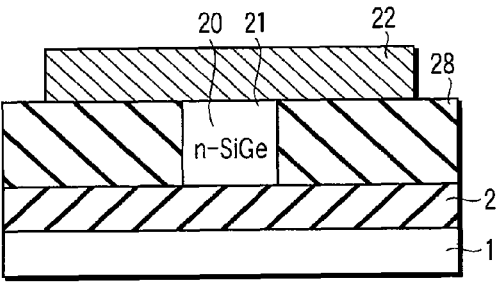
F I G. 9B

SEMICONDUCTOR DEVICE AND MANUFACTURING METHOD THEREOF

CROSS-REFERENCE TO RELATED APPLICATIONS

This application is a divisional of U.S. application Ser. No. 11/950,716, filed on Dec. 5, 2007 now U.S. Pat. No. 8,008,751, now pending, which is based upon and claims the benefit of priority from prior Japanese Patent Application No. 2006-332020, filed Dec. 8, 2006, the entire contents of which are incorporated herein by reference.

BACKGROUND OF THE INVENTION

1. Field of the Invention

The present invention relates to a semiconductor device in which an n-channel MIS transistor and a p-channel MIS transistor are formed on the same substrate, and a manufacturing method thereof.

2. Description of the Related Art

An improvement in performance of a CMOS circuit has been achieved by miniaturization of an MISFET based on a scaling law. However, in the present day, a gate length is 50 nm or below, which raises various problems due to miniaturization. Therefore, in order to further improve the performance of a CMOS circuit, a technology of increasing a mobility of a channel as well as miniaturization is required. As means for increasing the mobility, a method of applying a strain to a channel, a method of using a plane orientation different from a regular (100) surface, or a method of using SiGe or Ge as a high-mobility material for a channel has been proposed.

On the other hand, suppression of an short channel effect is the most important problem in an extremely scaled MISFET, and a multi-gate MISFET superior in immunity of short channel effects has attracted attention in recent years. In the multi-gate MISFET, since a controlling power of a gate is increased as compared with a conventional planar MISFET, the short channel effect is suppressed. Therefore, it can be considered that appropriate integration of the mobility enhancement technologies and these multi-gate MISFETs is important to realize a lower power consumption/high-performance CMOS in the future.

However, in order to obtain a high mobility for both an nMISFET and a pMISFET in a CMOS structure using the multi-gate MISFET, it has been conventionally considered that current directions must be changed depending on the nMISFET and the pMISFET (see, e.g., JP-A 2001-160594 (KOKAI)). That is, in the case of using a regular (001) substrate, a Fin side surface is a (100) surface when a current direction is a <100> direction, and the Fin side surface is a (110) surface when the current direction is a <110> direction. On the other hand, mobilities of electrons and holes vary depending on respective surfaces, and the mobility of electrons has a relationship of (100)>(110), and the mobility of holes has a relationship of (100)<(110). Therefore, the current direction must be set to the <100> direction in the nMISFET, and the current direction must be set to the <110> direction in the pMISFET. In order to set such current directions, a device direction of the nMISFET must be inclined 45° with respect to a device direction of the pMISFET, and there is a problem of an area penalty or complication of a circuit design.

Further, although using a single semiconductor layer as a material is desirable for fabrication of the multi-gate MISFET in terms of a scalability of the Fin, a method of using the single semiconductor layer to uniformly apply a tensile strain to the nMISFET in the current direction and a compressive strain to the pMISFET in the current direction has not been realized yet.

As explained above, it has been conventionally considered that device directions of the nMISFET and the pMISFET must be inclined by 45°, the Fin side surface must be set as a (100) surface in the nMISFET, and the Fin side surface must be set as a (110) surface in the pMISFET in order to optimize plane orientations and strains in both the nMISFET and the pMISFET in the multi-gate CMOS structure. However, this structure has a problem of an area penalty or complication of a circuit design. Furthermore, using a single semiconductor layer to uniformly apply an optimum strain to each of the nMISFET and the pMISFET is difficult.

Therefore, realization of a semiconductor device having the multi-gate CMOS structure that can improve a mobility of each device without inclining device directions in the nMISFET and the pMISFET and a manufacturing method thereof is demanded.

BRIEF SUMMARY OF THE INVENTION

According to a first aspect of the invention, there is provided a semiconductor device, which includes: an insulator layer; and an n-channel MIS transistor having an n channel and a pMIS transistor having a p channel which are formed on the insulator layer, wherein the n channel of the n-channel MIS transistor is formed of an Si layer having a uniaxial tensile strain in a channel length direction, the p channel of the p-channel MIS transistor is formed of an SiGe or Ge layer having a uniaxial compressive strain in the channel length direction, and the channel length direction of each of the n-channel MIS transistor and the p-channel MIS transistor is a <110> direction.

According to a second aspect of the invention, there is provided a method of manufacturing a semiconductor device, which includes: forming an Si layer having a biaxial tensile strain on an insulator; epitaxially growing an SiGe layer on a part of the Si layer; oxidizing the SiGe layer to form an SiGe or Ge layer having a compressive strain on the insulator; leaving the respective layers in a stripe pattern parallel to a <110> direction by etching to form a first semiconductor region made of an Si layer having a uniaxial tensile strain in the <110> direction and a second semiconductor region made of an SiGe or Ge layer having a uniaxial compressive strain in the <110> direction; forming an n-channel MIS transistor having the uniaxial tensile strain along a channel length direction in the first semiconductor region; and forming a p-channel MIS transistor having the uniaxial compressive strain along a channel length direction in the second semiconductor region.

BRIEF DESCRIPTION OF THE SEVERAL VIEWS OF THE DRAWING

FIG. 5 is a birds-eye view showing directions of stresses applied to the semiconductor device according to the first embodiment;

FIG. 6 is a birds-eye view showing a modification of the first embodiment;

FIGS. 7A and 7B are cross-sectional views showing an outline structure of a semiconductor device according to a second embodiment, where FIG. 7A corresponds to a cross section taken along the line B1-B1' in FIG. 1 and FIG. 7B corresponds to a cross section taken along the line B2-B2' in FIG. 1;

FIGS. 8A and 8B are cross-sectional views showing an outline structure of a semiconductor device according to a third embodiment, where FIG. 8A corresponds to a cross section taken along the line B1-B1' in FIG. 1 and FIG. 8B corresponds to a cross section taken along the line B2-B2' in FIG. 1; and FIGS. 9A and 9B are cross-sectional views showing an outline structure of a semiconductor device according to a fourth embodiment, where FIG. 9A corresponds to a cross section taken along the line B1-B1' in FIG. 1 and FIG. 9B corresponds to a cross section taken along the line B2-B2' in FIG. 1.

DETAILED DESCRIPTION OF THE INVENTION

In embodiments according to the present invention explained below, Si having a uniaxial tensile strain in a channel length direction is used to form an nMISFET, and SiGe or Ge having a uniaxial compressive strain in a channel direction is used to form a pMISFET. As a result, mobilities can be improved in both the nMISFET and the pMISFET. Moreover, since the nMISFET and the pMISFET have the same current direction, a problem of an area penalty or complication of a circuit design does not arise.

Particulars of the present invention will now be explained hereinafter based on illustrated embodiments.

First Embodiment

Figure 1:
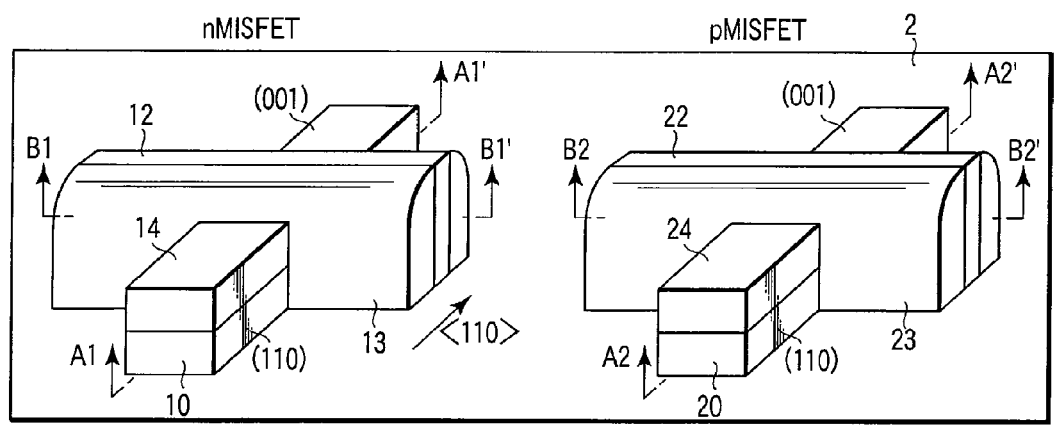
FIG. 1 is a birds-eye view showing an outline structure of a semiconductor device according to a first embodiment.
Figures 2A, 2B:
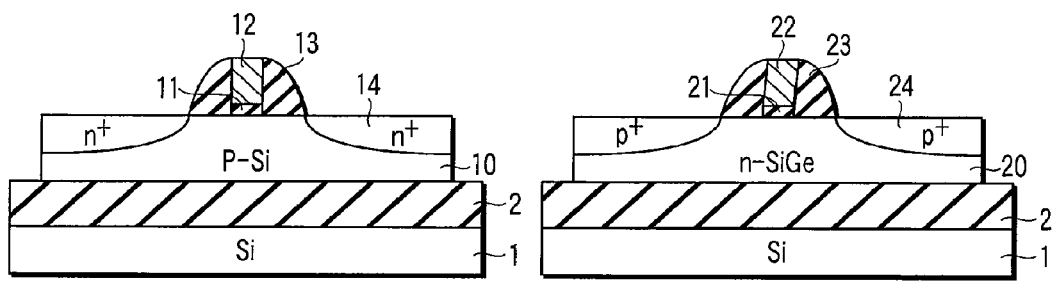
FIGS. 2A and 2B are cross-sectional views showing the outline structure of the semiconductor device according to the first embodiment, where FIG. 2A corresponds to a cross section taken along a line A1-A1' in FIG. 1 and FIG. 2B corresponds to a cross section taken along a line A2-A2' in FIG. 1.

In a semiconductor device according to a first embodiment, as shown in FIG. 1, a p-type Si layer (a first semiconductor region) 10 having a uniaxial tensile strain is formed in a Fin shape on a part of a buried insulating film 2 formed on a single-crystal Si substrate 1. This Si layer 10 is formed to extend in a <110> direction, and a direction of the strain is the <110> direction. Additionally, an n-type SiGe layer (a second semiconductor region) 20 having a uniaxial compressive strain is formed in a Fin shape on a part of the insulating film 2 in parallel with the Si layer 10. This SiGe layer 20 is also formed to extend in the <110> direction and a direction of the strain is the <110> direction like the Si layer 10.

A first gate insulating film 11 is formed to cover an upper surface and both side surfaces of a central part of the Si layer 10, and a first gate electrode 12 is formed to cover this gate insulating film 11. The gate electrode 12 is formed on not only the gate insulating film 11 but also the insulating film 2 to extend in a direction perpendicular to the <110> direction. A gate sidewall insulating film 13 is formed on side surfaces of the gate electrode 12. A first source/drain region 14 is formed in a surface portion of the Si layer 10. As a result, an nMISFET having a Fin structure is configured.

A second gate insulating film 21 is formed to cover an upper surface and both side surfaces of a central part of the SiGe layer 20, and a second gate electrode 22 is formed to cover this gate insulating film 21. The gate electrode 22 is formed on not only the gate insulating film 21 but also the insulating film 2 to extend in a direction perpendicular to the <110> direction. A gate sidewall insulating film 23 is formed on side surfaces of the gate electrode 22. A second source/drain region 24 is formed in a surface portion of the SiGe layer 20. As a result, a pMISFET having a Fin structure is configured.

According to such a structure, a channel of the nMISFET is formed of Si having a uniaxial tensile strain, and a channel of the pMISFET is formed of SiGe having a uniaxial compressive strain. Further, a substrate plane orientation is (001), and both the nMISFET and the pMISFET has the same current direction, i.e., the <110> direction. Therefore, a plane orientation of a channel side surface is a (110) surface.

Each of the gate insulating films 11 and 21 may be formed of $SiO_2$ or an insulating film material having a higher dielectric constant than $SiO_2$ (a high-k insulating film). For example, it is possible to use SiON, $Si_3N_4$, $Al_2O_3$, $Ta_2O_5$, $TiO_2$, $La_2O_5$, $CeO_2$, $ZrO_2$, $HfO_2$, $SrTiO_3$, or $Pr_2O_3$. Furthermore, like a Zr silicate or an Hf silicate, a material obtained by mixing a metal ion in a silicon oxide is also effective, and a combination of these materials may be employed.

Moreover, as each of the gate electrodes 12 and 22, a material required in a transistor for each generation, e.g., polycrystal Si, SiGe, Ge, a silicide, a germano-silicide, or various kinds of metals can be appropriately selected and used. For the source/drain region 14 or 24, a silicide, a germano-silicide, or a germanide can be used. As the gate sidewall insulating film 13 or 23, an Si oxide film, an Si nitride film, or a laminated film including these films is desirable.

It is to be noted that a semiconductor layer remains in each of the source/drain regions 14 and 24 in the drawing, but each of the source/drain regions 14 and 24 may be all formed of a metal. Additionally, it is possible to adopt a so-called metal source/drain structure in which a semiconductor layer subjected to impurity doping is not provided between the source/drain region 14 or 24 and a channel.

A manufacturing method of the semiconductor device according to this embodiment will now be explained with reference to FIGS. 4A to 4E.

Figure 4A:
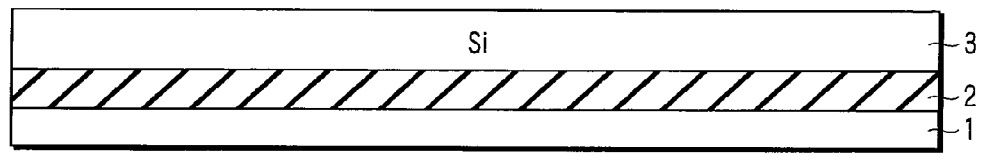
FIGS. 4A to 4E are cross-sectional views showing a manufacturing process of the semiconductor device according to the first embodiment in stages.

As depicted in FIG. 4A, a single-layer strained SOI (SSOI) substrate having an in-plane biaxial tensile strain is used as a base substrate (K. Rim et al., "Fabrication and mobility characteristics of ultra-thin strained Si directly on insulator (SS-DOI) MOSFETs," Technical Digest of International Electron Devices Meeting, p. 47-52, 2003). That is, a substrate in which the buried insulating film 2 made of, e.g., $SiO_2$ is formed on the single-crystal silicon substrate 1 and a single-crystal p-type Si layer 3 having a biaxial tensile strain is formed thereon is used. In this example, a (001) surface is presumed as a substrate plane orientation. Although a fabrication method of the SSOI substrate is arbitrary, having a strain amount of 0.4% or above is desirable. Furthermore, a film thickness of the Si layer 3 is typically 10 nm or above. Of course, an initial SSOI substrate may be subjected to epitaxial growth of Si to increase the film thickness of the Si layer 3.

Figure 4B:
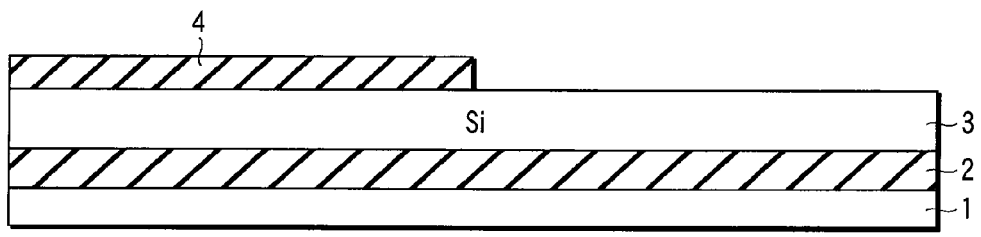

As shown in FIG. 4B, the SSOI substrate is first used to deposit a mask material 4 for selective epitaxial growth on the Si layer 3, and photolithography and etching are performed to remove the mask material 4 on the pMISFET region. As the mask material 4, an Si oxide film or an Si nitride film is desirable.

Figure 4C:
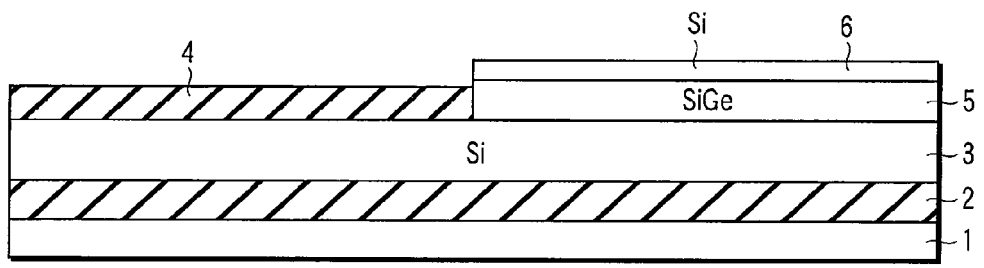

Then, as shown in FIG. 4C, selective growth of an n-type SiGe layer 5 is carried out. Although a film thickness and a Ge composition of the SiGe layer 5 are arbitrary, appropriately performing adjustment in such a manner that the nMISFET and the pMISFET have the same Fin height is desirable. For example, when a film thickness of the Si layer 3 is 50 nm and a Ge concentration in the pMISFET region is 50%, assuming that a Ge concentration in the SiGe layer to be selectively grown is 20%, a film thickness of the SiGe layer 5 is 125 nm. It is to be noted that successively growing an Si layer 6 of 1 nm or above after growth of the SiGe layer 5 is desirable. That is because oxidation processing is performed at the next step but directly oxidizing the SiGe layer 5 may result in surface roughness.

Figure 4D:
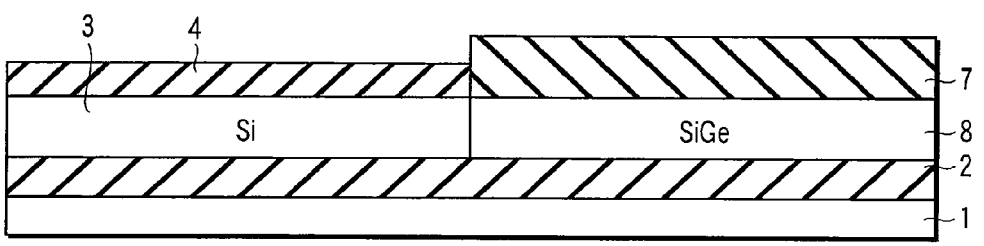

Then, as shown in FIG. 4D, oxidation processing is carried out while leaving the mask material 4 in the nMISFET region. Although an oxidizing atmosphere does not have to be 100% oxygen, a dry atmosphere is adopted. Moreover, an oxidizing temperature is a temperature which does not exceed a fusing point of SiGe in the Fin. Of course, the oxidizing temperature and oxidizing gas partial pressure do not have to be fixed during oxidation, and they may be appropriately adjusted.

When the SiGe layer 5 is oxidized in the dry atmosphere, Si is selectively oxidized to form an oxide film 7, and Ge is condensed into a base semiconductor (T. Tezuka et al., "A novel fabrication technique of ultrathin and relaxed SiGe buffer layers with high Ge fraction for Sub-100 nm strained silicon-on-insulator MOSFETs," Japanese Journal of Applied Physics, vol. 40, p. 2866-2874, 2001). That is, the Ge composition in the pMISFET region is increased with progress of oxidation. Additionally, since Ge atoms are diffused in the semiconductor layer during oxidation, the Ge composition can be uniformed in a thickness direction.

That is, the pMISFET region can be substituted by an SiGe layer 8 (an SiGe on Insulator: SGOI) layer having a high Ge concentration while the nMISFET region remains as the SSOI. Further, when the final Ge composition is set to satisfy the following conditions, a compressive strain can be applied to the SGOI layer. As the conditions, an in-plain lattice constant in the case of no strain in the SGOI layer must be larger than an in-plane lattice constant of the base SSOI substrate.

Figure 4E:
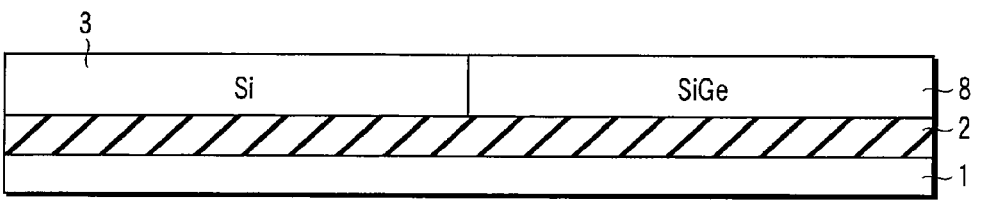

Then, as shown in FIG. 4E, the mask material 4 in the nMISFET region and the oxide film 7 in the pMISFET region are removed after formation of the SGOI layer. As a result, the p-type Si layer 3 having the biaxial tensile strain and the n-type SiGE layer 8 having the biaxial compressive strain can be formed on the insulating film 2.

In the thus fabricated substrate, as shown in a birds-eye view of FIG. 5, the Fin serving as an active region of the multi-gate MISFET is formed. That is, the stripe p-type Si layer 10 having a uniaxial tensile strain in the <110> direction is formed in the nMISFET forming region, and the stripe n-type SiGe layer 20 having a uniaxial compressive strain in the <110> direction is formed in the pMISFET region.

The Fin may be fabricated by processing a mask material based on regular photolithography or electron beam lithography and then effecting anisotropic etching. Furthermore, it is possible to adopt a so-called sidewall transfer (SWT) process of forming a sidewall on a dummy member on the substrate and utilizing this sidewall as a mask for Fin formation (Y.-K Choi et al, "Sub-20 nm CMOS FinFET technologies," Technical Digest of International Electron Devices Meeting, p. 421-424, 2001), but the forming method is not limited to such.

As a width of the Fin, a range of 5 nm to 500 nm is desirable. That is because the Fin is apt to fall and subsequent device fabrication becomes difficult when the width of the Fin is shorter than 5 nm and the uniaxial strain cannot be provided when the width of the Fin exceeds 500 nm.

In regard to a direction of the Fin, a longitudinal direction is set to the <110> direction so that a current direction becomes the <110> direction. It is known that a strain in a narrow side is relaxed when the fine mesa structure is formed in this manner (T. Irisawa et al., "High current drive uniaxially-strained SGOI pMOSFETs fabricated by lateral strain relaxation technique," VLSI Technology 2005, Digest of Technical Papers, p. 178-179, 2003, and T. Lei et al., "Strain relaxation in patterned strained silicon directly on insulator structures," Applied Physics Letters, vol. 87, p. 2338-2340, 2006). Consequently, as shown in FIG. 5, the uniaxial tensile strain in the current direction is applied to a channel of the nMISFET, and the uniaxial compressive strain in the current direction is applied to a channel of the pMISFET.

In the pMISFET, the uniaxial compressive strain in the current direction is an optimum strain direction in both the (001) surface/<110> direction of the upper surface of the Fin and the (110) surface/<110> direction of the side surface of the same (H. Irie et al., "In-plane mobility anisotropy and universality under uni-axial strains in n- and p-MOS inversion layers on (100), (110), and (111) Si," Technical Digest of International Electron Devices Meeting, p. 225-228, 2004). Moreover, since a hole mobility on the (110) surface/<110> direction is higher than a hole mobility on the (100) surface, a very high mobility is realized in a multi-gate SGOI-pMISFET fabricated by this method (T. Irisawa et al., "High performance multi-gate pMOSFETs using uniaxially-strained SGOI channels," Technical Digest of International Electron Devices Meeting, p. 727-730, 2005).

On the other hand, in the nMISFET having the uniaxial tensile strain in the current direction, a high mobility can be likewise expected for the following reasons. First, in the (001) surface/<110> direction of the upper surface, an effect is smaller than that in the case of the biaxial tensile strain when the strain is small, but a larger increase in a mobility can be expected than that in the biaxial tensile strain when the strain is large (0.8% or above) (K. Uchida et al., "Physical mechanisms of electron mobility enhancement in uniaxial stressed MOSFETs and impact of uniaxial stress engineering in ballistic regime," Technical Digest of International Electron Devices Meeting, p. 135-138, 2005). That is because, when the uniaxial strain in the <110> direction is applied, an effect of suppressing phonon scattering due to band splitting of 6-fold degenerate conduction band valleys is obtained and an effective mass in the <110> direction of electrons in 2-fold degenerate conduction band valleys occupied by many electrons is reduced.

Additionally, in the (110) surface/<110> direction of the side surface, when no strain is applied, since electrons occupy more 4-fold degenerate conduction band valleys having a large effective mass in the <110> direction, a mobility is reduced as compared with the (001) surface. However, when the uniaxial tensile strain is applied in the <110> direction, the 2-fold degenerate conduction band valleys having a small effective mass in the <110> direction are energetically lowered, and electrons preferentially occupy the 2-fold degenerate conduction band valleys, thereby greatly increasing the mobility. In this case, since the effective mass in the <110> direction of the 2-fold degenerate conduction band valleys is likewise reduced, it can be considered that the uniaxial tensile strain in the <110> direction has an optimum strain direction when the strain is also large on the (110) surface like the (001) surface.

As explained above, according to the structure of this embodiment, the plane orientation and the strain direction are optimized in both the nMISFET and the pMISFET, and the nMISFET and the pMISFET have the same current direction. As a result, it is possible to realize the multi-gate CMOS structure which does not lead to an area penalty or complication of a circuit design while improving the mobility.

Thereafter, a semiconductor device having such a multi-gate CMOS structure as shown in FIG. 1 can be fabricated through regular fine MISFET fabricating processes, i.e., formation of the gate insulating films 11 and 21, formation of the gate electrodes 12 and 22, formation of an extension doping layer, formation of the gate sidewall insulating films 13 and 23, and formation of the source/drain regions 14 and 24.

As explained above, according to this embodiment, the multi-gate CMOS formed of the Si-nMISFET having the uniaxial tensile strain and the SGOI (GOI)-pMISFET having the uniaxial compressive strain can be realized. Further, in this case, the plane orientation and the strain direction are optimized in both the nMISFET and the pMISFET, and the nMISFET and the pMISFET have the same current direction. As a result, a driving force can be improved without an area penalty or complication of a circuit design.

It is to be noted that the plane orientation of the base substrate is (001) in this embodiment, but the present invention is likewise effective when the plane orientation of the base substrate is the (110) surface. In this case, as shown in FIG. 6, the upper surface of the Fin is the (110) surface, and the side surface of the Fin is the (001) surface. In this case, likewise, an increase in mobility due to a strain can be obtained in both the nMISFET and the pMISFET of both a multi-gate MISFET and a planar MISFET for the same reason as that in the case using the (001) substrate.

Second Embodiment

Figures 3A, 3B:
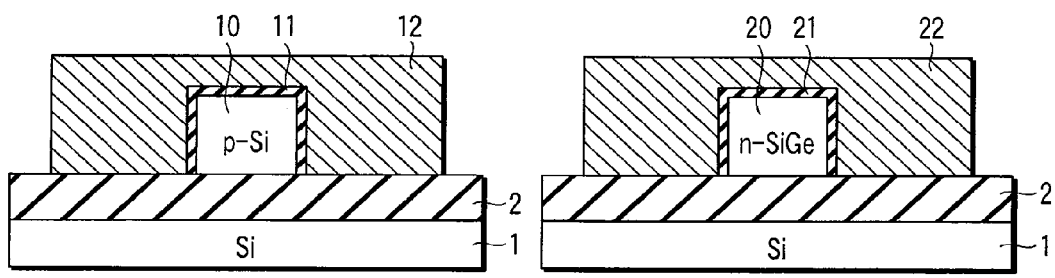
FIGS. 3A and 3B are cross-sectional views showing the outline structure of the semiconductor device according to the first embodiment, where FIG. 3A corresponds to a cross section taken along a line B1-B1' in FIG. 1 and FIG. 3B corresponds to a cross section taken along a line B2-B2' in FIG. 1.

FIGS. 7A and 7B are cross-sectional views showing a device structure of a semiconductor device having a multi-gate CMOS structure according to a second embodiment of the present invention. It is to be noted that like reference numerals denote parts equal to those in FIGS. 3A and 3B, thereby omitting a detailed explanation thereof.

The embodiment of the tri-gate MISFET in which the upper surface and the side surfaces of the Fin are used as the channels has been explained in the first embodiment. The second embodiment shows fabrication of a gate all-around MISFET in which an entire Fin is covered with a gate.

In this embodiment, a Fin is formed in each of an nMISFET forming region and a pMISFET forming region as shown in FIG. 5, and then a buried oxide film 2 under a channel of each Fin is removed by wet etching. Thereafter, a first gate insulating film 11 and a first gate electrode 12 are formed to surround the entire channel in the nMISFET forming region, and a second gate insulating film 21 and a second gate electrode 22 are formed to surround the entire channel in the pMISFET forming region.

Even if such a structure is adopted, the same effect as that in the first embodiment can be obtained. Further, since the gate all-around structure is adopted, a controlling power of the gate electrodes over the channels can be further increased.

Third Embodiment

FIGS. 8A and 8B are cross-sectional views showing a device structure of a semiconductor device having a multi-gate CMOS structure according to a third embodiment of the present invention. It is to be noted that like reference numerals denote parts equal to those in FIG. 3, thereby omitting a detailed explanation thereof.

This embodiment shows fabrication of a double-gate MISFET using both side surfaces alone of a Fin as channels.

In this embodiment, gate insulating films 11 and 21 and gate electrodes 12 and 22 are formed in a state where mask materials 16 and 26 (e.g., Si nitride films) used to form Fins are left on Fin upper surfaces. As a result, the upper surfaces of the Fins are not controlled by the gate electrodes 12 and 22, thus fabricating the double-gate MISFET.

Even if such a structure is adopted, the same effect as that in the first embodiment can be obtained. Moreover, in this embodiment, since a hole mobility has a relationship of (110) >(100), an effect of increasing the mobility can be obtained in a pMISFET as compared with a tri-gate structure.

Additionally, in this embodiment, forming each of the mask materials 16 and 26 with a large thickness enables electrically isolating the gate electrodes 12 and 22 on both sides of the Fins, thereby independently controlling right and left channels based on the double gate.

Fourth Embodiment

FIGS. 9A and 9B are cross-sectional views showing a device structure of a semiconductor device having a multi-gate CMOS structure according to a fourth embodiment of the present invention. It is to be noted that like reference numerals denote parts equal to those in FIG. 3, thereby omitting a detailed explanation thereof.

This embodiment shows a case where the present invention is applied to a regular planar MISFET using Fin upper surfaces alone as channels.

In this embodiment, a Fin is formed in each of an nMISFET forming region and a pMISFET forming region as shown in FIG. 5, and then a device isolation process, e.g., regular STI (Shallow Trench Isolation) is carried out to bury and flatten each of device isolation insulating films 18 and 28 in both side surfaces of each Fin and to expose the upper surfaces alone of the respective Fins. Subsequently, in the nMISFET forming region, a first gate insulating film 11 is formed on an upper surface of an Si layer 10, and a second gate electrode 12 is formed on the first gate insulating film 11 and the buried insulating film 18. Further, in the pMISFET forming region, a first gate insulating film 21 is formed on an upper surface of an SiGe layer 20, and a second gate electrode 22 is formed on the first gate insulating film 21 and the buried insulating film 28.

If such a structure is adopted, a plane orientation and a strain direction are optimized in each of the nMISFET and the pMISFET, and the planar CMOS structure in which current directions are equal to each other can be realized.

(Modification)

It is to be noted that the present invention is not restricted to the respective foregoing embodiments. Although the example where each of the nMISFET and the pMISFET is constituted of one Fin has been explained in the embodiments, the present invention is effective for each MISFET constituted of a plurality of Fins. Furthermore, the second semiconductor region is not restricted to SiGe, and Ge may be used. Moreover, the base substrate of the buried insulating film is not necessarily restricted to the single-crystal Si substrate, and various kinds of semiconductor substrates can be used.

Additionally, although Si is of the p type and SiGe or Ge is of the n type in the embodiments, the conductivity types of the first and second semiconductor regions are not necessarily restricted, and an intrinsic semiconductor having no impurity doped therein may be used.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

The invention claimed is:

1. A semiconductor device comprising:
an insulator layer;
a first semiconductor region formed in a linear shape having two side surfaces, an upper surface and a lower surface along a <110> direction on the insulator layer, one of the upper surface and each of the two side surfaces having a (110) surface, and the first semiconductor region being made of Si having a uniaxial tensile strain in the <110> direction;
an n-channel MIS transistor formed in the first semiconductor region, the n-channel MIS transistor including a first gate electrode formed on the two side surfaces, the upper surface, and the lower surface of the first semiconductor region through a first gate insulating film and having the <110> direction as a channel length direction thereof and a first source/drain region formed on the first semiconductor region to interpose the first gate electrode therebetween;
a second semiconductor region having two side surfaces, an upper surface and a lower surface along the <110> direction on the insulator layer, one of the upper surface and each of the two side surfaces having a (110) surface, and the second semiconductor region being made of SiGe or Ge having a uniaxial compressive strain in the <110> direction; and
a p-channel MIS transistor formed on the second semiconductor region, the p-channel MIS transistor including a second gate electrode formed on the two side surfaces, the upper surface and the lower surface of the second semiconductor region through a second gate insulating film and having the <110> direction as a channel length direction thereof and a second source/drain region formed on the second semiconductor region to interpose the first gate electrode therebetween.

2. The device according to claim 1, wherein the upper surface of each of the first semiconductor region and the second semiconductor region is a (001) surface.

3. The device according to claim 1, wherein the upper surface of each of the first semiconductor region and the second semiconductor region is a (110) surface.

4. The device according to claim 1, wherein a width of each of the first semiconductor region and the second semiconductor region perpendicular to the longitudinal direction thereof falls within the range of 5 nm to 500 nm, each limit inclusive.

5. The device according to claim 1, wherein the two side surfaces of each of the first semiconductor region and the second semiconductor region are (110) surfaces.

6. The device according to claim 1, wherein a strain amount of each of the unixaial tensile strain and the uniaxial compressive strain is 0.4% or above.

7. The device according to claim 1, wherein a strain amount of each of the unixaial tensile strain and the uniaxial compressive strain is 0.8% or above.

8. The device according to claim 1, wherein the two side surfaces of each of the first semiconductor region and the second semiconductor region are (001) surfaces, and the upper surface of each of the first semiconductor region and the second semiconductor region is the (110) surface.

9. A semiconductor device comprising:
an insulator layer;
a first semiconductor region having a first surface along a <110> direction on the insulator layer, the first surface having a (110) surface, and the first semiconductor region being made of Si having a uniaxial tensile strain in the <110> direction;
an n-channel MIS transistor formed on the first semiconductor region, the n-channel MIS transistor including a first gate electrode formed on at least the first surface of the first semiconductor region through a first gate insulating film and having the <110> direction as a channel length direction thereof and a first source/drain region formed on the first semiconductor region to interpose the first gate electrode therebetween;
a second semiconductor region having a second surface along the <110> direction on the insulator layer, the second surface having a (110) surface, and the second semiconductor region being made of SiGe or Ge having a uniaxial compression strain in the <110> direction; and
a p-channel MIS transistor formed on the second semiconductor region, the p-channel MIS transistor including a second gate electrode formed on the second surface of the second semiconductor region through a second gate insulating film and having the <110> direction as a channel length direction thereof and a second source/drain region formed on the second semiconductor region to interpose the first gate electrode therebetween.

10. The device according to claim 9, wherein the first surface is an upper surface of the first semiconductor region and the second surface is an upper surface of the second semiconductor region.

11. The device according to claim 10, wherein side surfaces of the first semiconductor region and the second semiconductor region are (001) surfaces.

12. The device according to claim 9, wherein the first surface is a side surface of the first semiconductor region and the second surface is a side surface of the second semiconductor region.

13. The device according to claim 12, wherein each of an upper surface of the first semiconductor region and the second semiconductor region is a (001) surface.

14. The device according to claim 9, wherein a width of each of the first semiconductor region and the second semiconductor region perpendicular to the longitudinal direction thereof falls within the range of 5 nm to 500 nm, each limit inclusive.

15. The device according to claim 9, wherein a strain amount of each of the uniaxial tensile strain and the uniaxial compressive strain is 0.4% or above.

16. The device according to claim 9, wherein a strain amount of each of the uniaxial tensile strain and the uniaxial compressive strain is 0.8% or above.

17. A semiconductor device comprising:
an insulator layer; and
an n-channel MIS transistor having an n-channel and a p-channel MIS transistor having a p-channel which are formed on the insulator layer, each of the n-channel and the p-channel having a (110) surface along a channel length direction, wherein the n-channel of the n-channel MIS transistor is formed of a Si layer having a uniaxial tensile strain in the channel length direction, the p-channel of the p-channel MIS transistor is formed of a SiGe or Ge layer having a uniaxial compressive strain in the channel length direction, and the channel length direction of each of the n-channel MIS transistor and the p-channel MIS transistor is a <110> direction.

18. The device according to claim 17, wherein an upper surface of each of the Si layer and the SiGe or Ge layer is the (110) surface.

* * * * *